United States Patent
Lee et al.

(10) Patent No.: US 8,206,530 B2
(45) Date of Patent: Jun. 26, 2012

(54) MANUFACTURING METHOD OF PRINTED CIRCUIT BOARD HAVING ELECTRO COMPONENT

(75) Inventors: Doo-Hwan Lee, Cheongju-si (KR); Kyung-Min Lee, Daejeon (KR); Hyo-Bin Park, Daejeon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 371 days.

(21) Appl. No.: 12/351,261

(22) Filed: Jan. 9, 2009

(65) Prior Publication Data
US 2010/0006203 A1 Jan. 14, 2010

(30) Foreign Application Priority Data
Jul. 10, 2008 (KR) .................. 10-2008-0066918

(51) Int. Cl.
*B29C 65/00* (2006.01)
*B32B 37/00* (2006.01)
(52) U.S. Cl. ........ 156/154; 156/153; 156/242; 174/250; 174/260
(58) Field of Classification Search .......... 156/153–154, 156/242, 244.11, 244.12, 244.16, 277, 250; 428/901; 174/260; 216/13, 17, 18, 20
See application file for complete search history.

(56) References Cited

U.S. PATENT DOCUMENTS
2002/0185303 A1* 12/2002 Takeuchi et al. ............. 174/256
2009/0205859 A1* 8/2009 Tanaka et al. ................. 174/260
2010/0163290 A1* 7/2010 Nagata ........................ 174/260

FOREIGN PATENT DOCUMENTS
| JP | 07-212002 | 8/1995 |
| JP | 2002-185145 | 6/2002 |
| JP | 2004-228397 | 8/2004 |
| JP | 2007-288109 | 11/2007 |

OTHER PUBLICATIONS

Japanese Office Action, with partial English translation, issued in Japanese Patent Application No. 2009-011407, mailed Mar. 1, 2011.
Japanese Office Action, and English translation thereof, issued in Japanese Patent Application No. 2009-011407 dated Dec. 16, 2009.

* cited by examiner

*Primary Examiner* — Khanh P Nguyen
*Assistant Examiner* — Carson Gross
(74) *Attorney, Agent, or Firm* — McDermott Will & Emery LLP (57) ABSTRACT

A manufacturing method of a printed circuit board having an electro component is disclosed. The method in accordance with an embodiment of the present invention includes: seating an electro component, in which an electrode is formed on an upper side, on an upper side of a bonding sheet; seating an insulator, in which a cavity corresponding to the electro component has been formed, on the upper side of the bonding sheet; laminating a first insulating resin on an upper side of the insulator such that an upper side of the electro component is covered; polishing the first insulating resin such that the electrode is exposed; and forming a first circuit pattern, which is electrically connected to the exposed electrode, on the polished first insulating resin.

7 Claims, 15 Drawing Sheets

MANUFACTURING METHOD OF PRINTED CIRCUIT BOARD HAVING ELECTRO COMPONENT

CROSS-REFERENCE TO RELATED APPLICATIONS

This application claims the benefit of Korean Patent Application No. 10-2008-0066918, filed with the Korean Intellectual Property Office on Jul. 10, 2008, the disclosure of which is incorporated herein by reference in its entirety.

BACKGROUND

1. Technical Field

The present invention relates to a manufacturing method of a printed circuit board having an electro component therein.

2. Description of the Related Art

As electro components become smaller and denser, the technology for bonding such electro components to a package has evolved and developed to cope with a finer pattern. The technology for a traditional bonding method of wire-bonding, for example, is being developed in order to have the electro component applied to a bonding pad having a pitch of about 40 to 50 um.

On the contrary, even though the technology, which is currently being developed, of mounting electro components copes with the fine pattern by means of the conventional laser method or flip chip method that uses a stud bump, there is a limit caused by the equipment and method thereof.

The key requirements for implementing a fine pitch in the substrate, in which the electro component is mounted, by using the laser method, in particular, are obtaining an interlayer registration and an insulation distance for minimizing the size of a via for interconnection, that is, minimizing the thickness of an insulation layer. However, it is possible to manipulate a pitch of about 100 um by means of technologies known up to now.

In addition, when a laser beam is used to connect an electro component to a substrate, upper and lower circuits in the layer, in which the electro component is mounted, only perform a function of mere alignment and electrical connection of the upper and lower parts of the layer. As a result, the circuit is included in a product as a kind of spare circuit. Accordingly, the circuit is not suitable for making the product smaller and denser.

SUMMARY

The present invention provides a manufacturing method of a printed circuit board having an electro component therein, which can be smaller and denser by obtaining an interlayer registration and minimizing the size of a via, without an unnecessary redundant circuit element when having an electro component in the printed circuit board.

An aspect of the present invention features a manufacturing method of a printed circuit board having an electro component therein. The method in accordance with an embodiment of the present invention can include: seating an electro component on an upper side of a bonding sheet, an electrode formed on an upper side the electro component; seating an insulator on the upper side of the bonding sheet, a cavity corresponding to the electro component having been formed in the insulator; laminating a first insulating resin on an upper side of the insulator such that an upper side of the electro component is covered; polishing the first insulating resin such that the electrode is exposed; and forming a first circuit pattern on the polished first insulating resin, the first circuit pattern being electrically connected to the exposed electrode.

The method can further include forming a via, the via passing through the bonding sheet from the first insulating resin; and forming a second circuit pattern on a lower side of the bonding sheet.

The method can further include laminating a second insulating resin on a lower side of the bonding sheet; forming a via, the via passing through the second insulating resin from the first insulating resin; and forming a second circuit pattern on a lower side of the insulating resin.

The first insulating resin can be thicker than the second insulating resin.

The bonding sheet can be made of an epoxy resin saturated with glass fiber. The insulator in which the cavity has been formed can be in a hardened state (C-stage).

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. In the following description of the present invention, the detailed description of known technologies incorporated herein will be omitted when it may make the subject matter unclear.

Terms such as "first" and "second" can be used in describing various elements, but the above elements shall not be restricted to the above terms. The above terms are used only to distinguish one element from the other.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Hereinafter, embodiments of a manufacturing method of a printed circuit board having an electro component in accordance with the present invention will be described in detail with reference to the accompanying drawings. In description with reference to accompanying drawings, the same reference numerals will be assigned to the same or corresponding elements, and repetitive descriptions thereof will be omitted.

Figure 1:
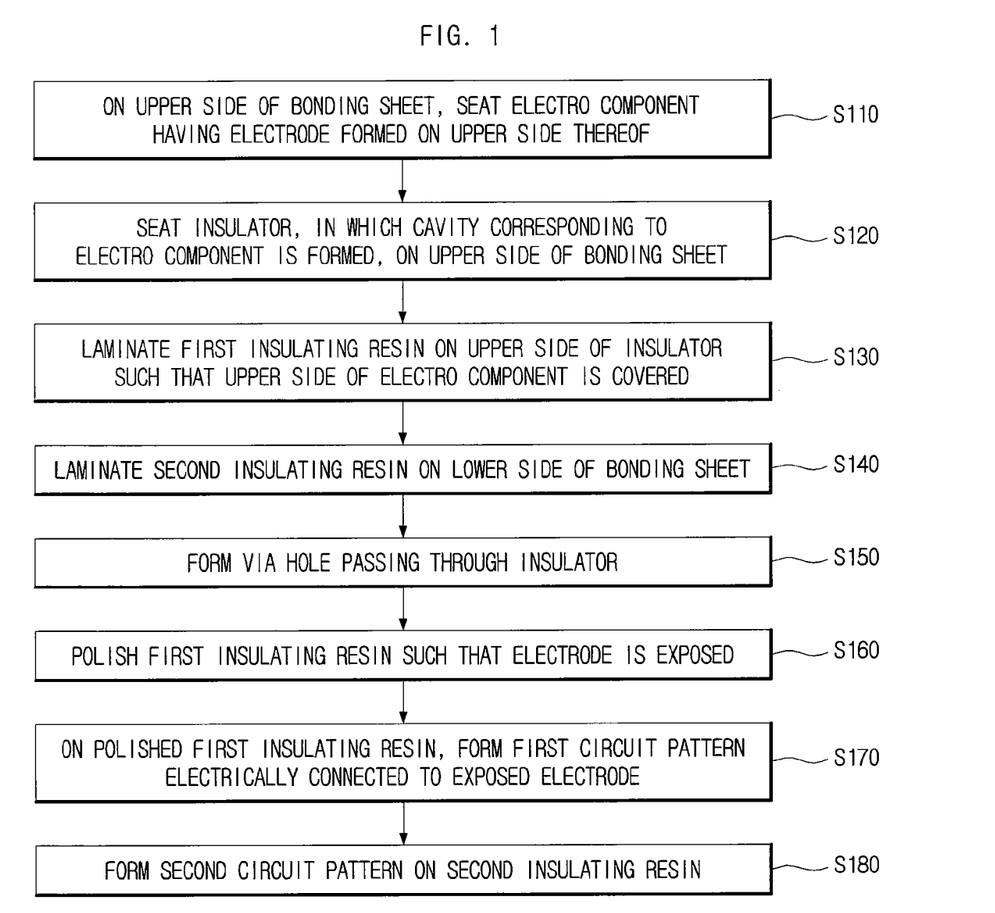
FIG. 1 is a flowchart showing a manufacturing method of a printed circuit board having an electro component in accordance with a first embodiment of the present invention.

FIG. 1 is a flowchart showing a manufacturing method of a printed circuit board having an electro component in accordance with a first embodiment of the present invention. FIGS. 2 to 10 are views showing a manufacturing method of a printed circuit board having an electro component in accordance with a first embodiment of the present invention. In FIGS. 2 to 10, illustrated are electro components 10a, 10b and 10c, electrodes 11a, 11b and 11c, a bonding sheet 20, an insulator 30, a cavity 32, a first insulating resin 41, a second insulating resin 42, a first circuit pattern 51, a second circuit pattern 52, a via hole 53 and a via 54.

Figure 2:
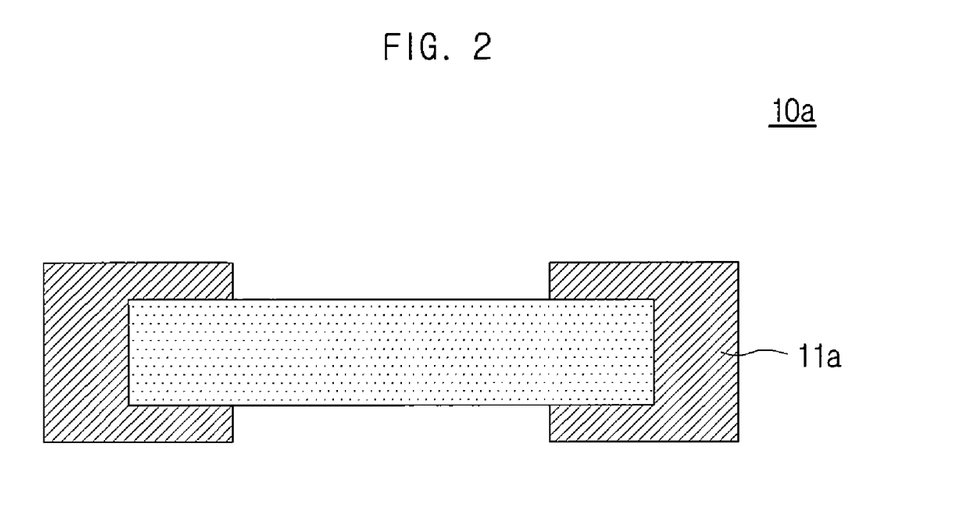
FIGS. 2 to 10 are views showing a manufacturing method of a printed circuit board having an electro component in accordance with a first embodiment of the present invention.
Figure 3:
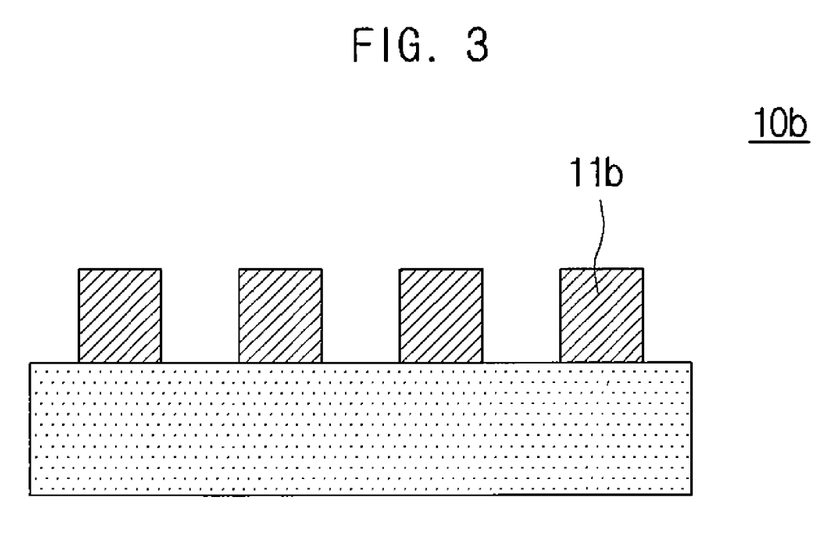
Figure 4:
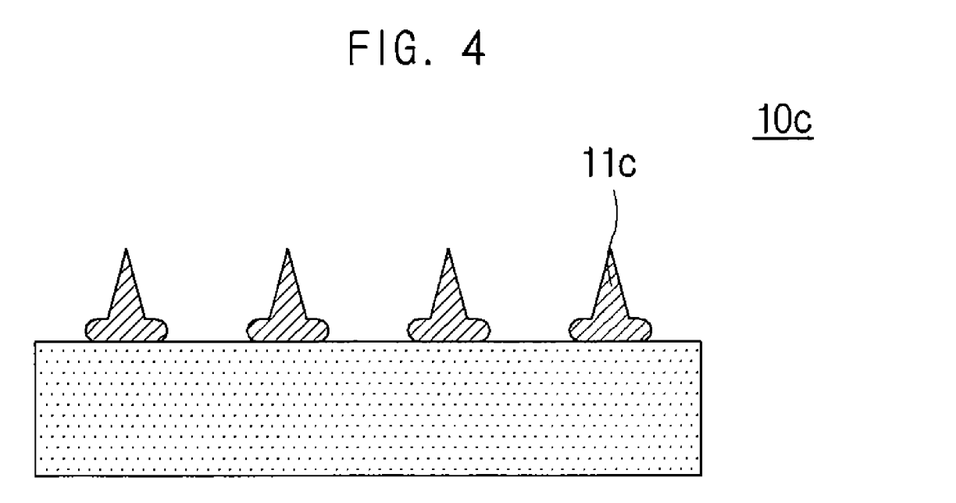
Figure 5:
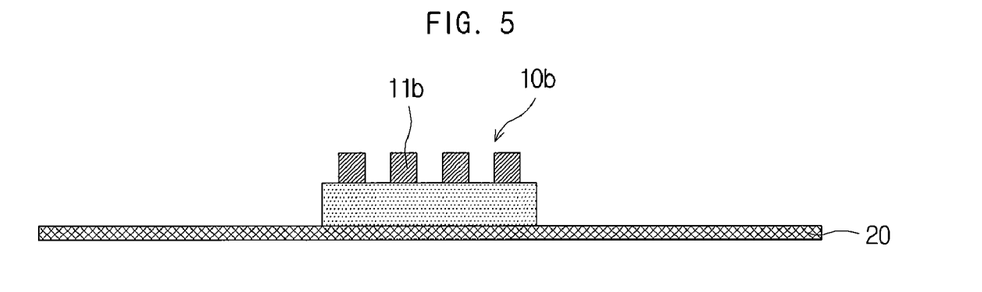

First, as shown in FIG. 5, an electro component having an electrode formed on the upper side thereof is seated on an upper side of the bonding sheet 20 (S110). The electro component that is seated on the bonding sheet 20 can be a passive component 10a having electrodes 11a formed on both sides thereof as shown in FIG. 2, an active component 10b having a post type electrode 11b made of copper or gold formed thereon as shown in FIG. 3, and an active component 10c having a stud type electrode 10c made of copper or gold formed thereon as shown in FIG. 4. Besides, if the electrode is formed to be taller than the outermost surface of an electronic component, any kind of electro component can be used.

A material having fluidity suitable for fixing an electronic part when being hardened, for example, an epoxy resin saturated with glass fiber, can be used as the bonding sheet 20 on which the electro components 10a, 10b and 10c are seated. Through use of such materials, it is possible to prevent the positions of the electro components 10a, 10b and 10c from changing in performing subsequent processes, thereby obtaining a highly reliable registration.

The thickness of the bonding sheet 20 can be about 20 to 40 um or 20 um or less.

Figure 6:
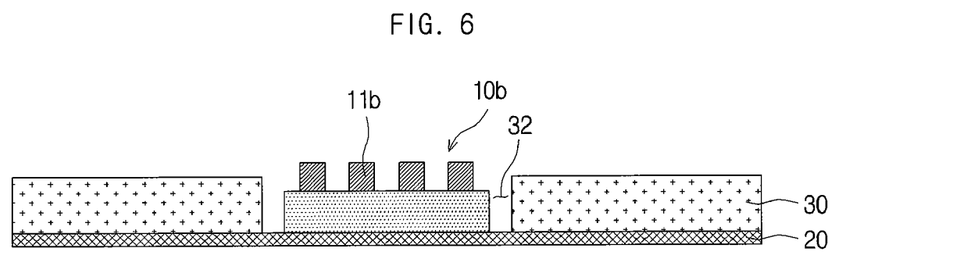

Then, as shown in FIG. 6, the insulator 30, in which the cavity 32 corresponding to the electro component 10b is formed, is seated on the upper side of the bonding sheet 20 (S120). While the thickness of the insulator is determined according to the thickness of the electro component 10b, the thickness of the insulator 30 can be about 40 um if the thickness of the electro component including the electrode is about 50 um.

Here, the insulator 30 having the cavity 32 formed therein can be in a hardened state (that is, C-stage). The clearance can be maintained by using the insulator 30 in the C-stage in spite of a subsequent process, such as lamination, making it easier to acquire registration of high reliability.

Such an insulator 30 can be manufactured by processing the cavity 32 on both sides of a copper-clad laminate (CCL) (not shown), and then by etching the entire copper foil formed on both sides of the CCL. The insulator 30 can be also manufactured by forming the cavity on an insulating material (not shown) having no metal foil formed thereon.

Figure 7:
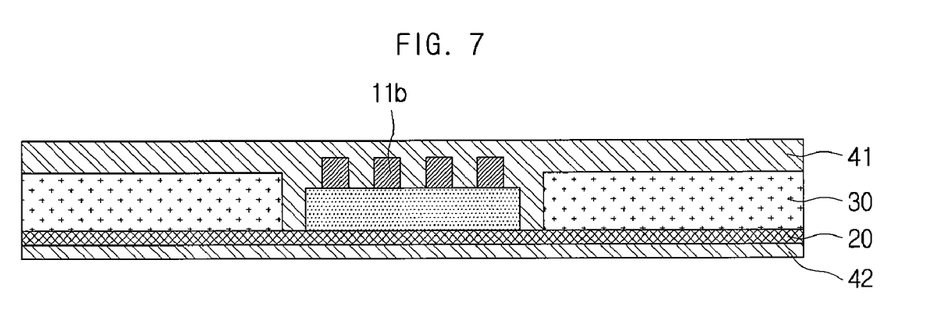

Then, as shown in FIG. 7, the first insulating resin 41 is laminated on the upper side of the insulator 30 such that the upper side of the electro component 10b is covered (S130), and the second insulating resin 42 is laminated on the lower side of the bonding sheet 20 (S140). The lamination of the first insulating resin 41 and the second insulating resin 42 can be performed simultaneously, through a single process, or sequentially.

Meanwhile, in consideration of filling the cavity 32 with the insulating resin, the first insulating resin 41 can be thicker than the second insulating resin 42. For example, the first insulating resin 41 laminated on the upper side of the insulator 30 can have a thickness of about 40 um and the second insulating resin 42 laminated on the lower side of the bonding sheet 20 can have a thickness of about 20 um.

A pure resin material, which is not saturated with glass fiber, can be used as the first insulating resin 41, in order to reduce the possibility of damaging the electrode 11b of the electro component 10b. It is also possible, depending the shape of the electrode, to use a typical prepreg.

Figure 8:
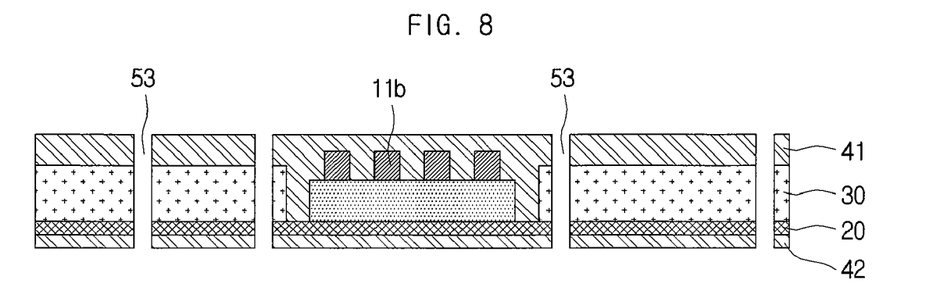

Subsequently, as shown in FIG. 8, a via hole 53 passing through the insulator is formed (S150). The via hole 53 is provided for implementing an interlayer through, which will be further described later, between the second circuit pattern 52 and the first circuit pattern 51. The via hole can be formed by means of a laser drill or a mechanical drill.

Figure 9:
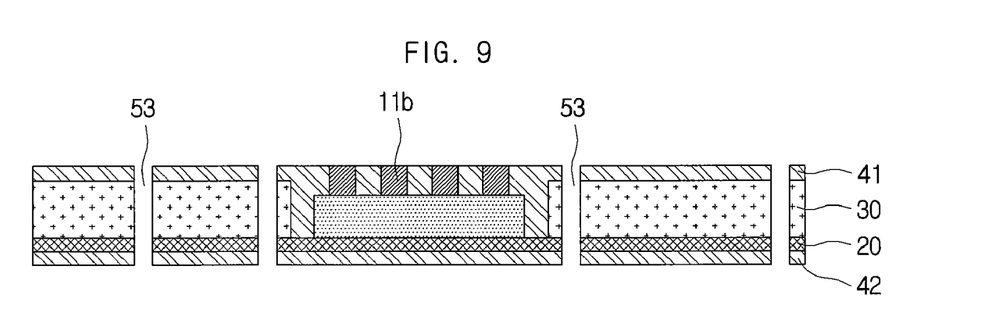

Next, as shown in FIG. 9, the first insulating resin 41 is polished such that the electrode 11b is exposed (S160). The first insulating resin 41 can be polished by means of plasma etching or desmear process, for example.

Figure 10:
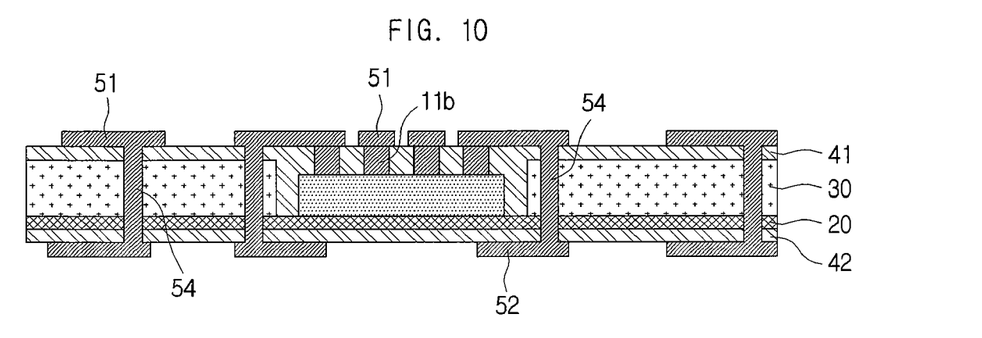

As shown in FIG. 10, after exposing the electrode 11b, the first circuit pattern 51 electrically connected to the exposed electrode 11b is formed on the polished first insulating resin 41 (S170). The second circuit pattern 52 is formed on the second insulating resin 42 (S180). It is also possible to form a via 54, electrically connecting the first circuit pattern 51 to the second circuit pattern 52, by forming a conductive material inside the via hole 53, which is already formed, as well as by forming the first circuit pattern 51 and the second circuit pattern 52.

As such, according to this embodiment of the present invention, the first circuit pattern 51 is formed on the first insulating resin 41 in a state where the electrode 11b is exposed, so that high registration can be easily obtained. Additionally, inner layer circuits 51 and 52 are directly formed in the inner layer having the electro component 10b mounted therein, so that a thin printed circuit board having a two layer structure can be manufactured.

Hereinafter, a manufacturing method of a printed circuit board having an electro component according to a second embodiment of the present invention will be described.

Figure 11:
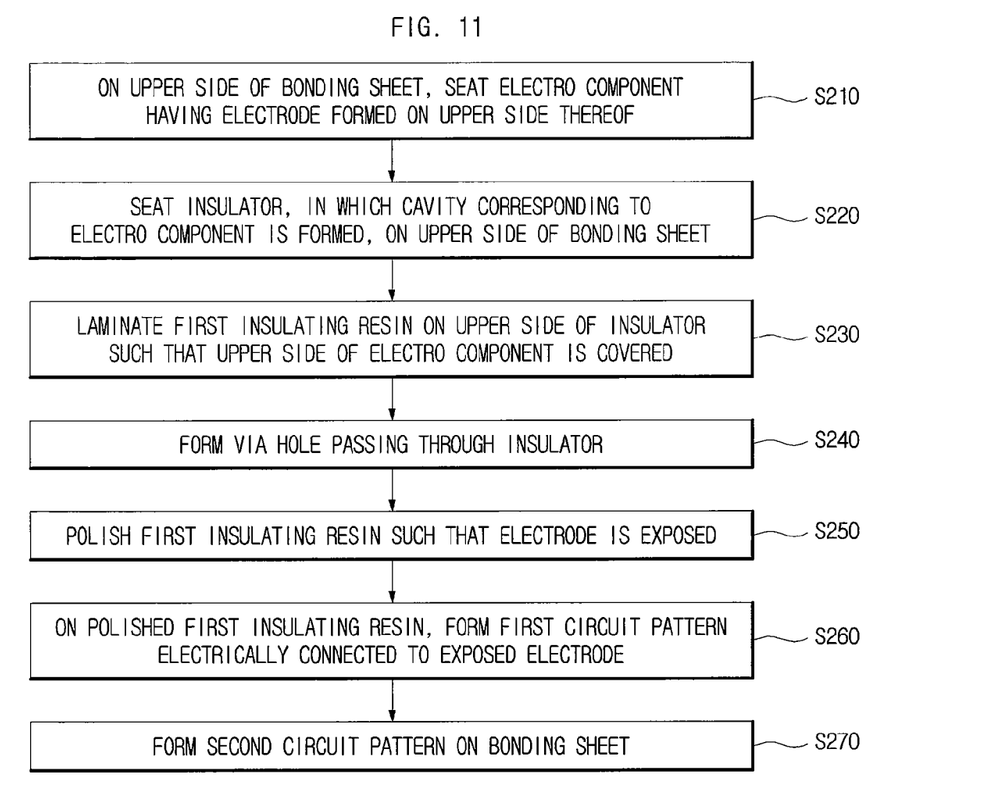
FIG. 11 is a flowchart showing a manufacturing method of a printed circuit board having an electro component in accordance with a second embodiment of the present invention.

FIG. 11 is a flowchart showing a manufacturing method of a printed circuit board having an electro component in accordance with a second embodiment of the present invention. FIGS. 12 to 15 are views showing a manufacturing method of a printed circuit board having an electro component in accordance with a second embodiment of the present invention. In FIGS. 12 to 15, illustrated are electro components 10a, 10b and 10c, electrodes 11a, 11b and 11c, a bonding sheet 20, an insulator 30, a cavity 32, a first insulating resin 41, a first circuit pattern 51, a second circuit pattern 52, a via hole 53 and a via 54.

Compared with the embodiment described above, this embodiment of the present invention features that the laminating of the second insulating resin 42 will be omitted and the second circuit pattern 52 is directly formed on the bonding sheet 20. This signifies that since the bonding sheet 20 can also perform a function of an insulating resin, when the issue of thickness control or reliability is an object, it is possible not to use a separate second insulating resin 42. Accordingly, in this embodiment of the present invention, the part of description that is the same as the embodiment described above will be omitted and the difference therefrom will be described only.

Figure 12:
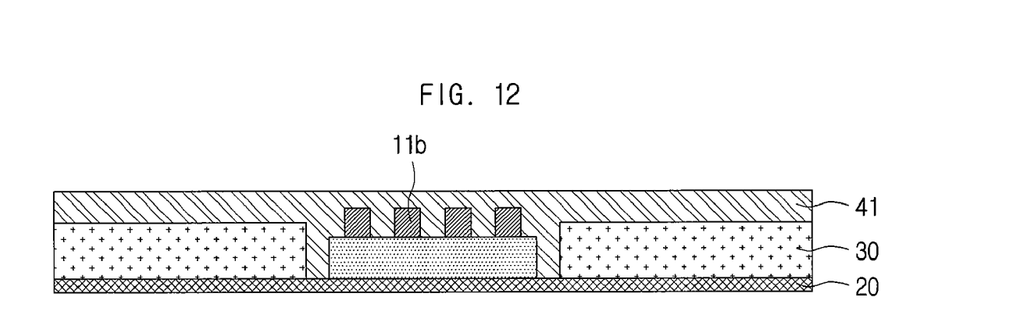
FIGS. 12 to 15 are views showing a manufacturing method of a printed circuit board having an electro component in accordance with a second embodiment of the present invention.

First, like the first embodiment, an electro component having an electrode 11b formed on the upper side thereof is seated on an upper side of the bonding sheet 20 (S210). The insulator 30 having the cavity 32 corresponding to the electro component 10b is seated on the upper side of the bonding sheet 20 (S220). The first insulating resin 41 is laminated on the upper side of the insulator 30 such that the upper side of the electro component 10b is covered (S230). The first insulating resin 41 laminated through this procedure is shown in FIG. 12. This procedure can be applied to implement a circuit pattern in a typical circuit board. However, in some cases, it is possible, when laminating the first insulating resin 41, to form a circuit by laminating a copper foil on the lower side of the bonding sheet 20, which is opposite to the upper side thereof.

Figure 13:
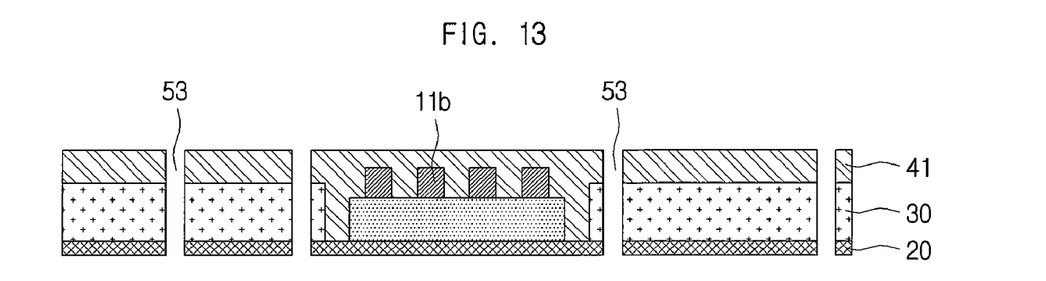
Figure 14:
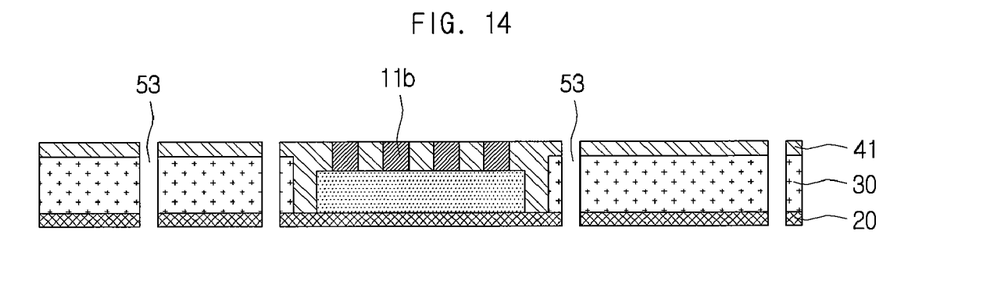

Subsequently, as shown in FIG. 13, the via hole 53 passing through the insulator is formed (S240). As shown in FIG. 14, the first insulating resin 41 is polished such that the electrode 11*b* is exposed (S250). As the embodiment described above, the first insulating resin 41 can be polished by means of plasma etching and desmear process.

Figure 15:
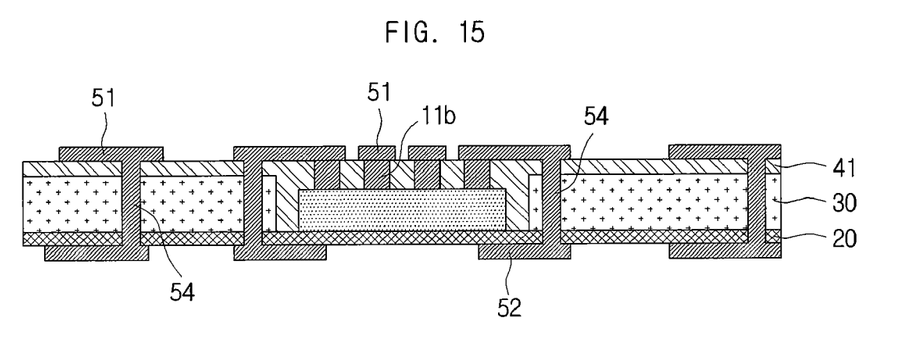

As shown in FIG. 15, after exposing the electrode 11*b*, the first circuit pattern 51 electrically connected to the exposed electrode 11*b* is formed on the polished first insulating resin 41 (S260). The second circuit pattern 52 is formed on the lower side of the bonding sheet 20 (S270). It is also possible to form a via 54, electrically connecting the first circuit pattern 51 to the second circuit pattern 52, by forming a conductive material inside the via hole 53, which is already formed, as well as by forming the first circuit pattern 51 and the second circuit pattern 52.

Like the structure presented in the embodiment described above, the structure manufactured through the process of this embodiment can easily obtain high registration. Additionally, inner layer circuits 51 and 52 can be directly formed in the inner layer, in which the electro component 10*b* is mounted, making it possible to realize a thin printed circuit board having a two layer structure.

While certain embodiments of the present invention have been described above, it shall be understood by those skilled in the art that various changes and modification in forms and details can be made without departing from the spirit and scope of the present invention as defined by the appended claims.

Numerous embodiments other than the embodiments described above are included within the claims of the present invention.

What is claimed is:

1. A manufacturing method of a printed circuit board having an electro component, the method comprising:

seating the electro component on an upper side of a bonding sheet, the electro component including an electrode formed on an upper side of the electro component;

seating an insulator on the upper side of the bonding sheet, the insulator including a cavity corresponding to the electro component formed in the insulator;

laminating a first insulating resin on an upper side of the insulator such that an upper side of the electro component is covered;

polishing an upper side of the first insulating resin entirely to remove all of the first insulating resin which is disposed higher than an upper surface of the electrode in the vertical direction, so that the electrode is exposed and a height of the first insulating resin is the same as a height of the upper surface of the electrode; and forming a first circuit pattern on the polished first insulating resin, the first circuit pattern electrically connected to the exposed electrode.

2. The method of claim 1, further comprising:

forming a via, the via passing through the bonding sheet from the first insulating resin; and forming a second circuit pattern on a lower side of the bonding sheet.

3. The method of claim 1, further comprising:

laminating a second insulating resin on a lower side of the bonding sheet;

forming a via, the via passing through the second insulating resin from the first insulating resin; and forming a second circuit pattern on a lower side of the second insulating resin.

4. The method of claim 3, wherein the first insulating resin is thicker than the second insulating resin.

5. The method of claim 1, wherein the bonding sheet is made of an epoxy resin saturated with glass fiber.

6. The method of claim 1, wherein the insulator in which the cavity has been formed is in a hardened state (C-stage).

7. The method of claim 1, wherein the first insulating resin is not saturated with glass fiber.

* * * * *